US008686367B2

(12) United States Patent
Shah

(10) Patent No.: US 8,686,367 B2
(45) Date of Patent: Apr. 1, 2014

(54) CIRCUIT CONFIGURATION AND METHOD FOR TIME OF FLIGHT SENSOR

(75) Inventor: Ashish A. Shah, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 118 days.

(21) Appl. No.: 13/410,086

(22) Filed: Mar. 1, 2012

(65) Prior Publication Data

US 2013/0228691 A1 Sep. 5, 2013

(51) Int. Cl.
*G01J 5/20* (2006.01)

(52) U.S. Cl.
USPC ........................................................ 250/341.8

(58) Field of Classification Search
USPC ........................................................ 250/341.8
See application file for complete search history.

(56) References Cited

U.S. PATENT DOCUMENTS

| 6,580,496 | B2 | 6/2003 | Bamji et al. | |
|---|---|---|---|---|
| 7,045,754 | B2 * | 5/2006 | Manabe et al. | 250/208.1 |
| 7,436,496 | B2 | 10/2008 | Kawahito | |
| 7,542,085 | B2 * | 6/2009 | Altice et al. | 348/296 |
| 8,089,036 | B2 | 1/2012 | Manabe | |
| 8,184,191 | B2 * | 5/2012 | Sugawa et al. | 348/314 |
| 2010/0020209 | A1 | 1/2010 | Kim | |
| 2010/0231774 | A1 | 9/2010 | Tashiro | |
| 2010/0276574 | A1 | 11/2010 | Manabe | |
| 2010/0303299 | A1 * | 12/2010 | Cho et al. | 382/106 |
| 2011/0157354 | A1 | 6/2011 | Kawahito | |
| 2011/0198481 | A1 | 8/2011 | Kim et al. | |
| 2011/0202310 | A1 * | 8/2011 | Min et al. | 702/166 |
| 2013/0181119 | A1 * | 7/2013 | Bikumandla et al. | 250/214.1 |
| 2013/0228691 | A1 * | 9/2013 | Shah | 250/341.8 |

FOREIGN PATENT DOCUMENTS

| JP | 2004-294420 A | 10/2004 |
|---|---|---|
| JP | 2005-175392 A | 6/2005 |
| JP | 2010-213231 A | 9/2010 |
| JP | 2011-243862 A | 12/2011 |

OTHER PUBLICATIONS

Gokturk, S. B., et al., "A Time-Of-Flight Depth Sensor—System Description, Issues and Solutions," Proceedings of the 2004 IEEE Computer Society Conference on Computer Vision and Pattern Recognition Workshops (CVPRW'04) (9 pages).
Kim, S., et al., "A Three-Dimensional Tim-of-Flight CMOS Image Sensor With Pinned-Photodiode Pixel Structure," IEEE Electron Device Letters, vol. 31, No. 11, Nov. 2010 (3 pages).

(Continued)

*Primary Examiner* — Marcus Taningco
(74) *Attorney, Agent, or Firm* — Blakely Sokoloff Taylor & Zafman LLP

(57) ABSTRACT

An apparatus includes a photodiode, a first and second storage transistor, a first and second transfer transistor, and a first and second output transistor. The first transfer transistor selectively transfers a first portion of the image charge from the photodiode to the first storage transistor for storing over multiple accumulation periods. The first output transistor selectively transfers a first sum of the first portion of the image charge to a readout node. The second transfer transistor selectively transfers a second portion of the image charge from the photodiode to the second storage transistor for storing over the multiple accumulation periods. The second output transistor selectively transfers a second sum of the second portion of the image charge to the readout node.

27 Claims, 7 Drawing Sheets

(56) References Cited

OTHER PUBLICATIONS

Dalla Betta, G., et al., "Design and Characterization of Current-Assisted Photonic Demodulators in 0.18-µm CMOS Technology," IEEE Transactions of Electron Devices, vol. 58, No. 6, Jun. 2011 (8 pages).

Mahdi, R., et al., "Lateral Drift-Field Photodetector for High Speed 0.35 µm CMOS Imaging Sensors Based on Non-Uniform Lateral Doping Profile, Design, theoretical concepts, and TCAD Simulations," Ph.D. Research in Microelectronics and Electronics (PRIME), 2010 Conference on, Jul. 21, 2010 (4 pages).

EP 13155816.5—Extended European Search Report, mailed Jul. 24, 2013 (7 pages).

JP 2013-055635—Japanese Office Action and English Translation, mailed Jan. 15, 2014 (8 pages).

\* cited by examiner

CIRCUIT CONFIGURATION AND METHOD FOR TIME OF FLIGHT SENSOR

TECHNICAL FIELD

This disclosure relates generally to sensors, and in particular but not exclusively, relates to image sensors capable of three-dimensional imaging.

BACKGROUND INFORMATION

Interest in image sensors capable of three-dimensional (3D) imaging is increasing as the popularity of 3D applications continues to grow in applications such as imaging, movies, games, computers, user interfaces, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera (ideally, approximating the human eye separation) in order to create the three dimensional images. In addition, this technique is complex and therefore requires significant computer processing power in order to create the 3D images in real time.

For applications that require the acquisition of 3D images in real time, active depth imaging systems based on the optical time of flight measurement are sometimes utilized. These time of flight systems typically employ a light source that directs light at an object, a sensor that detects the light that is reflected from the object, and a processing unit that calculates the distance to the object based on the round trip time that it takes for light to travel to and from an object. In typical time of flight sensors, photodiodes are often used because of the high transfer efficiency from the photo detection regions to the sensing nodes. Some known time of flight sensors need larger pixel sizes to collect an acceptable signal level from the light (which is often low intensity and short duration light) reflected off of the object. Some known time of flight sensors accumulate and store charge through multiple accumulations of the light from the light source to attain higher signal levels. However, leakage current may drain the stored charge during the multiple accumulations of the light, leaving poor signal to noise ratios.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Methods and apparatuses for acquiring time of flight and depth information using a 3D time of flight sensor are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

As will be shown, examples of a time of flight sensor with a circuit design that allows for storage of charges with less leakage are disclosed. By allowing charges to be stored with less leakage, the charge may be stored longer and still achieve an acceptable signal to noise ratio. The longer storage time may allow for smaller pixels that can capture time of flight image signals over a longer period of time rather than using larger pixels to capture the time of flight image signals over a short period of time.

Figure 1A:
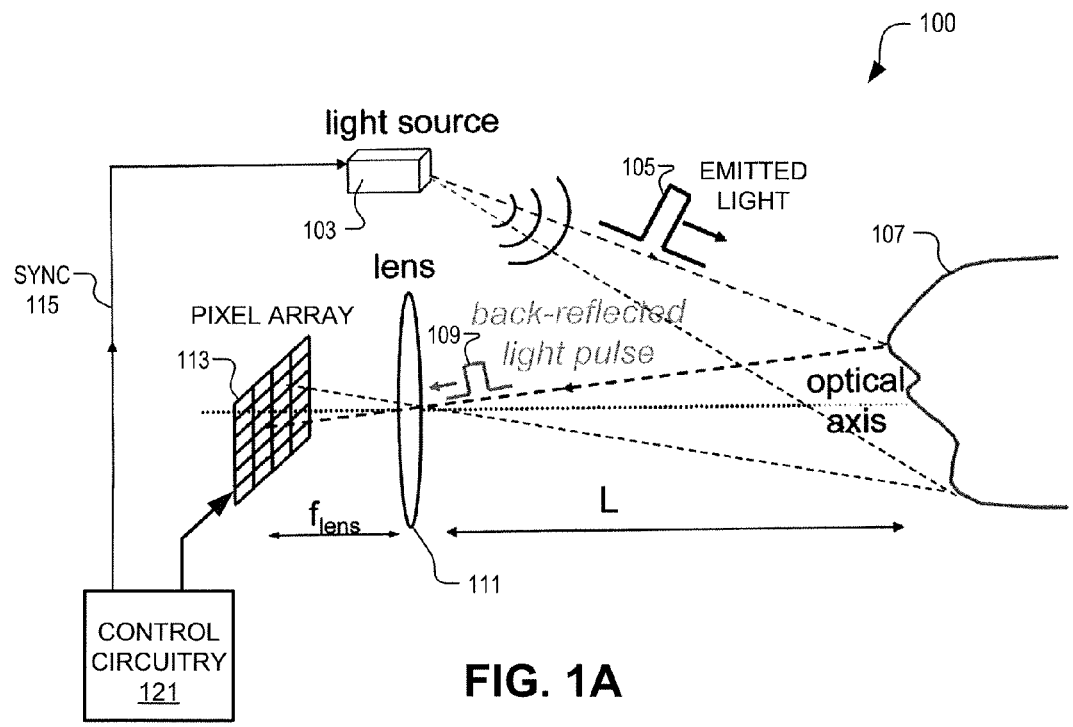
FIG. 1A is a block diagram that shows one example of a time of flight sensing system, in accordance with the teachings of the present invention.

To illustrate, FIG. 1A is a block diagram that shows one example of a time of flight sensing system 100 in accordance with the teachings of the present invention. As shown, time of flight sensing system 100 includes a light source 103 that emits modulated pulses, which are illustrated as emitted light 105 in FIG. 1A. As shown, the emitted light 105 is directed to an object 107. In one example, emitted light 105 includes light pulses of infrared (IR) light. It is appreciated that in other examples, the emitted light 105 may have wavelengths other than infrared, such as for example visible light, near-infrared light, etc., in accordance with the teachings of the present invention. The emitted light 105 is then reflected back from object 107, which is shown as back-reflected light 109 in FIG. 1A. As shown, the reflected light 109 is directed from object 107 through a lens 111 and is then focused onto a time of flight pixel array 113. In one example, time of flight pixel array 113 includes a plurality of time of flight pixels arranged in a two dimensional array. As will be discussed, in one example, a sync signal 115 is generated by control circuitry 121 and sent to light source 103 to synchronize the light pulses of emitted light 105 with corresponding modulation signals that control the plurality of pixels in time of flight pixel array 113 in accordance with the teachings of the present invention. The sync signal 115 may be a clock signal that directs light source 103 to emit a light pulse or light pulses for a pre-determined duration known to light source 103. In one example, sync signal 115 contains the duration of a light pulse or light pulses emitted by light source 103.

In the example depicted in FIG. 1A, time of flight pixel array 113 is positioned at a focal length $f_{lens}$ from lens 111. As shown in the example, light source 103 and the lens 111 are positioned a distance L from the object. Lens 111 may be a microlens among a plurality of microlenses disposed over time of flight pixel array 113. Lens 111 may be a fixed field lens or an assembly containing microlenses and a fixed field lens. It is appreciated of course that FIG. 1A is not illustrated to scale and that in one example, the focal length $f_{lens}$ is substantially less than the distance L between lens 111 and object 107. Therefore, it is appreciated that for the purposes of this disclosure, that the distance L and the distance L+focal length $f_{lens}$ are substantially equal for purposes of time of flight measurements in accordance with the teachings of the present invention.

Figure 1B:
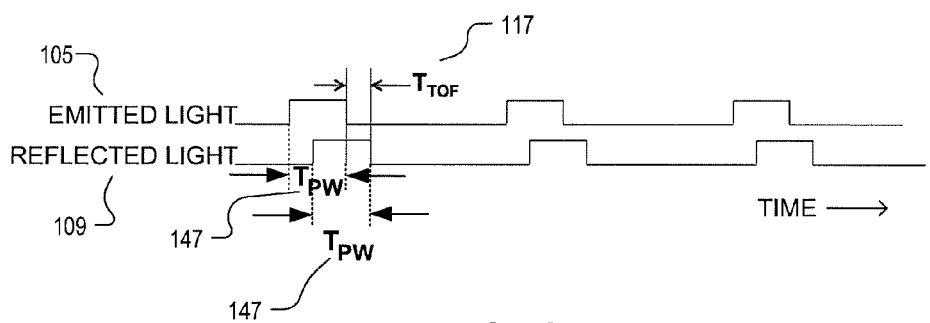
FIG. 1B is a timing diagram that shows an example of light pulses emitted from a light source relative to the receipt of the reflected light pulses in an example time of flight imaging system, in accordance with the teachings of the present invention.

FIG. 1B is a timing diagram that illustrates the timing relationship between example pulses of light emitted from a light source relative to the receipt of the back-reflected pulses of light in an example time of flight imaging system in accordance with the teachings of the present invention. Specifically, FIG. 1B shows emitted light 105, which represents the modulated light pulses that are emitted from light source 103 to object 107. FIG. 1B also shows reflected light 109, which represents the reflected light pulses that are back-reflected from object 107 and received by time of flight pixel array 113. In one example, light source 103 emits the light pulses of emitted light 105 with a duty cycle of less than 10%. In one example, the pulse widths $T_{PW}$ 147 of the light pulses have a duration in the range of 20 nanoseconds to 100 nanoseconds. It is appreciated of course that other duty cycles and pulse widths for emitted light 105 may also be utilized in accordance with the teachings of the present invention. As shown, the light pulses of emitted light 105 and reflected light 109 all have the same pulse widths $T_{PW}$ 147.

As shown in the depicted example, due to the amount of time that it takes for the light pulses to travel the distance L from light source 103 to object 107, and then the additional time it take for the reflected light pulses to travel the distance L back from object 107 to time of flight pixel array 113, there is a delay time of $T_{TOF}$ 117 between the emission of a light pulse of emitted light 105 and the receipt of that light pulse in reflected light 109. The time difference $T_{TOF}$ 117 between emitted light 105 and reflected light 109 represents the time of flight for the light pulses to make the round trip between light source 103 and object 107. Once the time of flight $T_{TOF}$ 117 is known, the distance L from light source 103 to object 107 can be determined using the following relationships in Equations (1) and (2) below:

$$T_{TOF} = \frac{2L}{c} \quad (1)$$

$$L = \frac{T_{TOF} \times c}{2} \quad (2)$$

where c is the speed of light, which is approximately equal to $3 \times 10^8$ m/s, and $T_{TOF}$ is the amount of time that it takes for the light pulse to travel to and from the object as shown in FIG. 1A.

Figure 2:
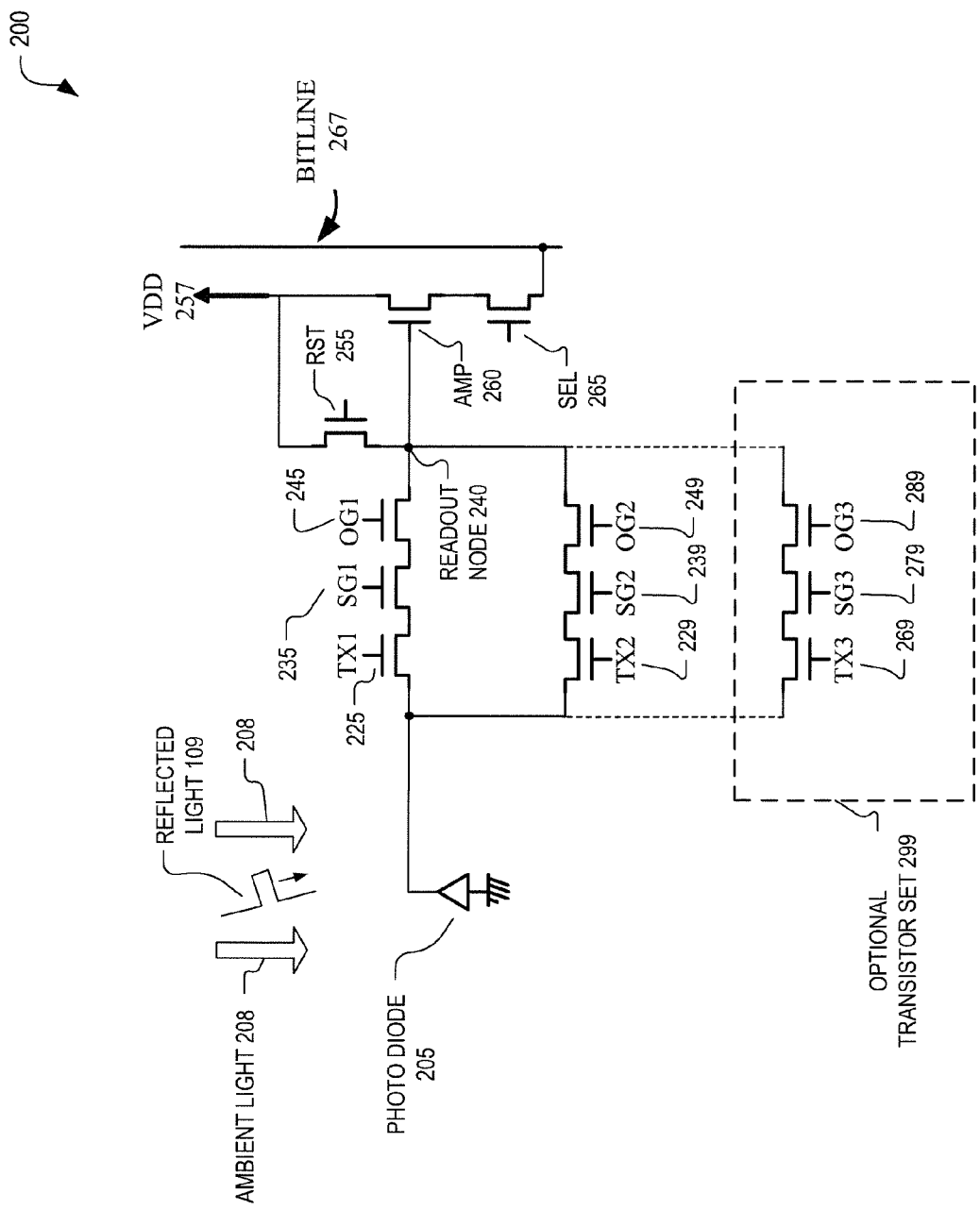
FIG. 2 is a schematic illustrating one example of time of flight pixel circuitry, in accordance with the teachings of the present invention.

FIG. 2 is a schematic illustrating one example of time of flight pixel circuitry in accordance with the teachings of the present invention. It is appreciated that time of flight pixel circuitry 200 can be implemented in one of the plurality of pixels included in the example time of flight pixel array 113 illustrated in FIG. 1A. As shown in the example depicted in FIG. 2, time of flight pixel circuitry 200 includes a photodiode 205, which accumulates charge in response to light incident on photodiode 205. In one example, the light incident upon photodiode 205 includes the reflected light 109 as discussed above with respect to FIGS. 1A and 1B. Ambient light 208 may also be incident on photodiode 205. Filters may be used to control the light that reaches photodiode 205. Calibration processes (mentioned below in connection with FIG. 4B) may be used to calculate the difference between image signals from photodiode 205 that are generated by ambient light 208 and images signals from photodiode 205 that are generated by reflected light 109.

Time of flight pixel circuitry 200 illustrated in FIG. 2 includes a storage transistor 235 (controlled by control signal SG1) coupled between a transfer transistor 225 (controlled by control signal TX1) and an output transistor 245 (controlled by control signal OG1). Transfer transistor 225 is coupled to photodiode 205 and output transistor 245 is coupled to readout node 240. The illustrated time of flight pixel circuitry 200 also includes a storage transistor 239 (controlled by control signal SG2) coupled between a transfer transistor 229 (controlled by control signal TX2) and an output transistor 249 (controlled by control signal OG2). Transfer transistor 229 is coupled to photodiode 205 and output transistor 249 is coupled to readout node 240. Storage transistors 235 and 239 can have a buried channel or a surface channel. The illustrated time of flight pixel circuitry 200 also includes reset transistor 255, amplifier transistor 260, and select transistor 265.

In the illustrated example, reset transistor 255 is coupled to a voltage source VDD 257. Photodiode 205 may be reset by selectively activating (turning ON) reset transistor 255 while activating transfer transistor 225, storage transistor 235, and output transistor 245 at the same time. In one example photodiode 205 can by reset by selectively activating reset transistor 255 while activating transfer transistor 229, storage transistor 239, and output transistor 249 at the same time. A controller such as control circuitry 121 can be used to control the transistors of time of flight pixel circuitry 200. After photodiode 205 is reset, storage transistors 235 and 239 may be initialized for storing image charge over multiple accumulation periods. In one example, control circuitry 121 may generate a negative voltage to be applied to the gate of storage transistor 235 and 239 before the storage transistor is activated.

Figure 3A:
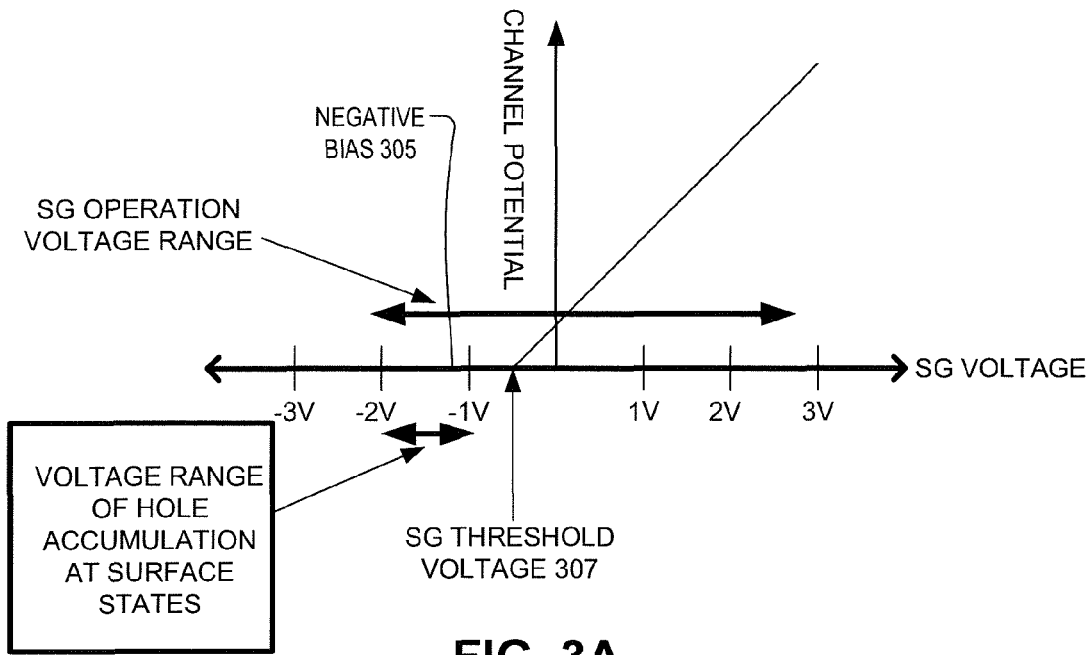
FIG. 3A is a line graph illustrating a negative gate voltage applied to the gate of a storage transistor during operation of a time of flight pixel, in accordance with the teachings of the present invention.
Figure 3B:
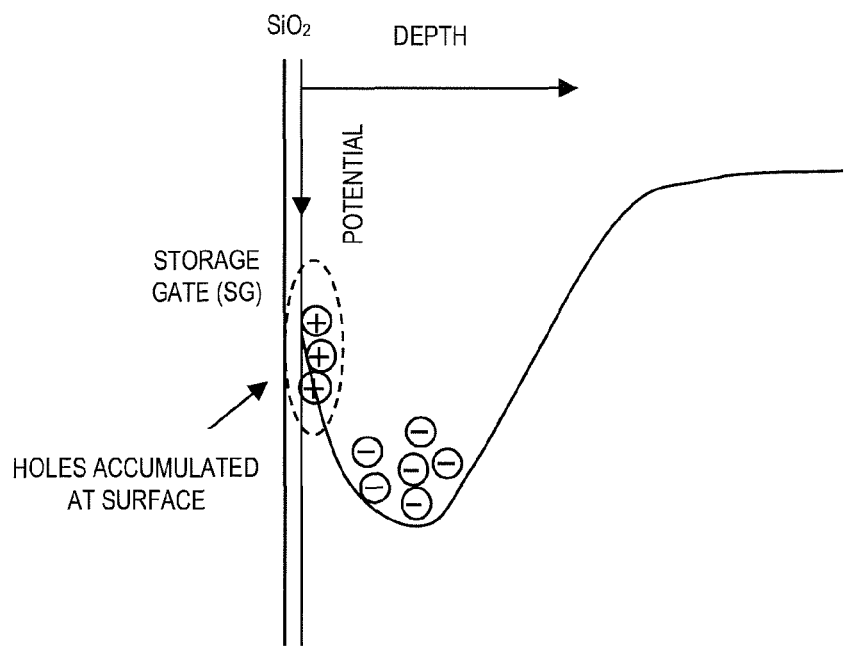
FIG. 3B is a line graph illustrating hole accumulation below the gate of a storage transistor during operation of a time of flight pixel, in accordance with the teachings of the present invention.

FIGS. 3A and 3B are line graphs illustrating a negative gate voltage applied to the gate of a storage transistor and the corresponding holes accumulated below the gate during operation of a time of flight pixel, in accordance with the teachings of the present invention. In one example, control circuitry 121 sends a control signal with a negative bias (e.g. negative bias 305) to a storage transistor (e.g. storage transistor 235 and 239). The control signal may be more than 0.5V below a threshold voltage (e.g. SG threshold voltage 307) of the storage transistor. In one example, the control signal has a voltage of −1.2V. Pre-biasing the gate of the storage transistor with a negative voltage "accumulates" holes in surface states in the substrate underneath the storage transistor (see FIG. 3B). The accumulated holes which are positively charged may physically repel the electrons from the surface states, and thus minimize electron interaction with the surface states. As a result, leakage current from surface states is reduced, which reduces the leakage current that drains the accumulated image charge from within the storage transistors. This may allow the storage gates to accumulate charge over a longer period of time (e.g. multiple accumulation periods), which allows for an improved signal to noise ratio.

While pre-biasing the storage transistors with a negative voltage, the storage transistor may require isolation from the transistors coupled to its source and drain. Control circuitry 121 may be used to deactivate (turn OFF) the adjacent transistors to achieve isolation. For example, control circuitry 121 may deactivate transfer transistor 225 and output transistor 245 while pre-biasing storage transistor 235. Similarly, control circuitry 121 may deactivate transfer transistor 229 and output transistor 249 while pre-biasing storage transistor 239.

Figure 4A:
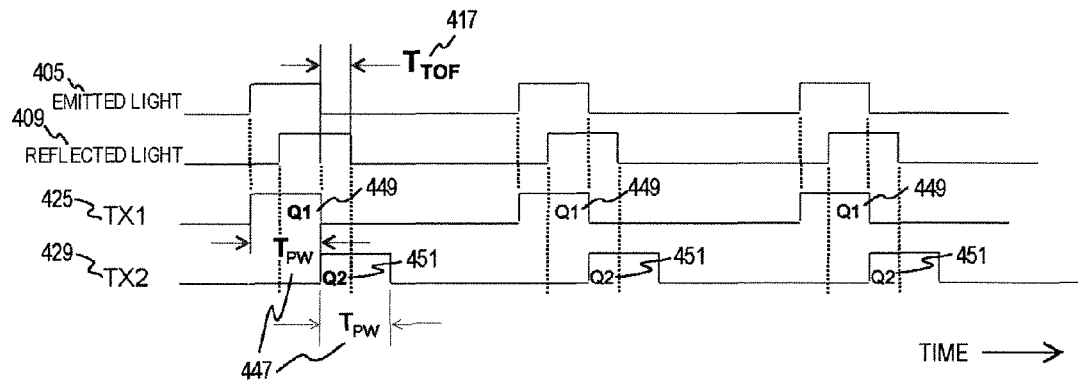
FIG. 4A is a timing diagram that shows an example of emitted pulses of light and the reflected pulses of the light relative to the switching of first and second transistors in an example time of flight imaging system, in accordance with the teachings of the present invention.
Figure 4B:
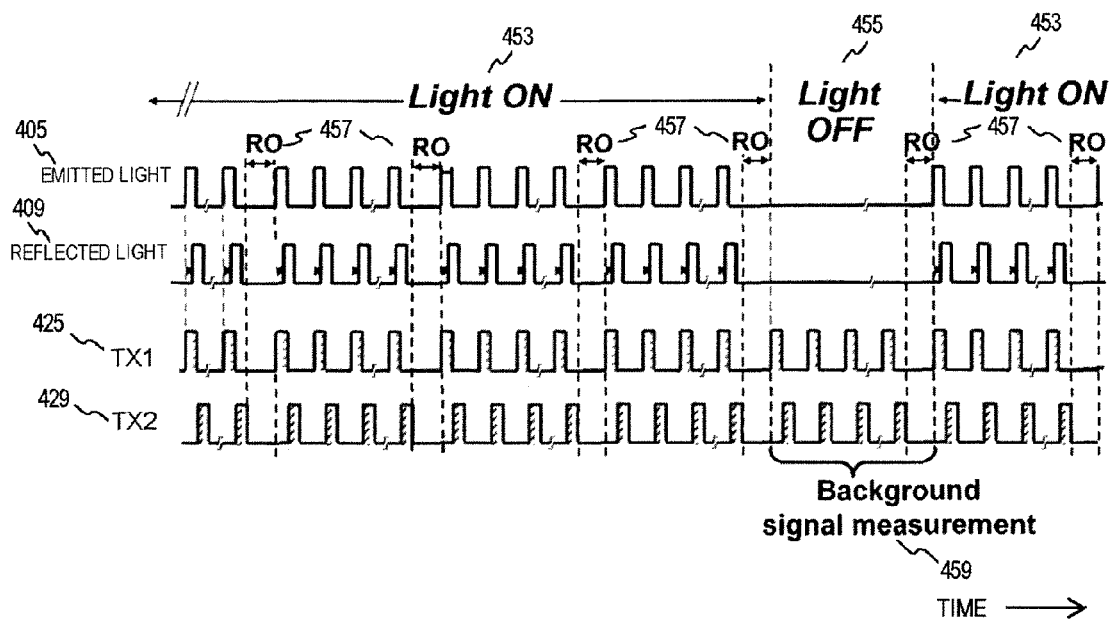
FIG. 4B is a timing diagram that shows another example of emitted pulses of light and the reflected pulses of the light relative to the switching of first and second transistors in an example time of flight imaging system, in accordance with the teachings of the present invention.

FIGS. 4A and 4B are example timing diagrams that may be used to help describe the operation of time of flight pixel circuitry 200 acquiring image charge in connection with the time of flight imaging systems and time of flight pixel circuitry in FIGS. 1-2 above. Specifically, FIG. 4A is a timing diagram that shows an example of modulated pulses of emitted light 405, and the corresponding pulses of reflected light 409, relative to switching modulation signals TX1 425 and TX2 429, in an example time of flight imaging system in accordance with the teachings of the present invention.

FIG. 4A illustrates that each time a light pulse from the emitted light 405 reflects off of object 107 and becomes reflected light 409, image charge can be accumulated in photodiode 205. In the illustrated example, emitted light 405 has a modulation frequency and may have a duty cycle of less than 10%. As shown in the example, reflected light 409 has the same modulation frequency of emitted light 405 as well as the same duty cycle and pulse width $T_{PW}$ 447. The on-time of a pulse width $T_{PW}$ 447 of emitted light 405 may be in the range of 20 nanoseconds to 100 nanoseconds. The light pulses of reflected light 409 are received by the pixels in time of flight pixel array 113 after time of flight $T_{TOF}$ 417 due to the time of flight of the light pulse to and from object 107.

The image charge accumulated in photodiode 205 from a single light pulse is the sum of Q1 449 and Q2 451. Q1 449 is accumulated by photodiode 205 during the time that transfer transistor 225 is activated and Q2 451 is accumulated by photodiode 205 during the time that transfer transistor 229 is activated. Transfer transistor 225 selectively transfers Q1 449 (a first-in-time portion of the image charge accumulated by photodiode 205) to storage transistor 235 when transfer transistor 225 is activated by control circuitry 121. First modulation signal TX1 425 activates transfer transistor 225 at the same time and for the same duration ($T_{PW}$ 447) that the light pulse making up emitted light 405 is being emitted from light source 103. Therefore, first modulation signal TX1 425 may be referred to as "in-phase" with emitted light 405.

Transfer transistor 229 selectively transfers Q2 451 (a second-in-time portion of the image charge accumulated by photodiode 205) to storage transistor 239 when transfer transistor 229 is activated by control circuitry 121. As shown in FIG. 4A, second modulation signal TX2 429 activates transfer transistor 229 immediately following the deactivation of transfer transistor 225 (corresponding with first modulation signal TX1 425). It is appreciated that transfer transistor 229 is activated for the same duration ($T_{PW}$ 447) as the light pulse that makes up emitted light 405 and the same duration ($T_{PW}$ 447) that transfer transistor 225 is activated. Given the relationship between second modulation signal TX2 429 and emitted light 405, second modulation signal TX2 429 may be referred to as "out-of-phase" with emitted light 405. Each pulse of second modulation signal TX2 429 immediately follows and does not overlap with each pulse of first modulation signal TX1 425. Therefore, as shown in FIG. 4A, each on-time pulse of reflected light 409 is received by photodiode 205 immediately after an ending portion of each pulse of first modulation signal TX1 425 and during a starting portion of each pulse of second modulation signal TX2 429 in accordance with the teachings of the present invention.

As mentioned above, transfer transistor 225 is switched in response to first modulation signal TX1 425 and transfer transistor 229 is switched in response to second modulation signal TX2 429. Thus, during each on-time pulse of first modulation signal TX1 425, the photogenerated charge accumulated in photodiode 205 is transferred to storage transistor 235. In the example, this photogenerated charge that is transferred from photodiode 205 to storage transistor 235 in response to the first modulation signal TX1 425 is represented as Q1 449 in FIG. 4A. Similarly, during each on-time pulse of second modulation signal TX2 429, the photogenerated charge accumulated in photodiode 205 is transferred to storage transistor 239. In the example, the photogenerated charge that is transferred from photodiode 205 to storage transistor 239 in response to second modulation signal TX2 429 is represented as Q2 451 in FIG. 4A.

In one example, the time of flight $T_{TOF}$ 417 that it takes for the light emitted from light source 103 to travel to and from object 107 can be determined according to the following relationship in Equation (3) below:

$$T_{TOF} = T_{PW}\left(\frac{\sum Q2}{\sum (Q1+Q2)}\right) \quad (3)$$

where $T_{TOF}$ represents the time of flight $T_{TOF}$ 417, $T_{PW}$ represents the pulse width $T_{PW}$ 447, $\Sigma Q2$ represents the total amount of charge Q2 accumulated in storage transistor 239 and $\Sigma(Q1+Q2)$ represents the sum of the total amount of charge accumulated in storage transistors 235 and 239. Once the time of flight $T_{TOF}$ 417 is determined, the $T_{TOF}$ result can then be substituted in to Equation (2) summarized above in order to determine the distance L in accordance with the teachings of the present invention.

FIG. 4B is a timing diagram that shows another example of emitted pulses of light and the reflected pulses of the light relative to the switching of transfer transistors 225 and 229 in an example time of flight imaging system in accordance with the teachings of the present invention. It is appreciated that FIG. 4B is similar to FIG. 4A, but that the time scale along the x-axis of FIG. 4B is of a lower resolution than the time scale of FIG. 4A. As such, FIG. 4B illustrates an example where charge is allowed to accumulate in storage transistor 235 and 239 over a plurality of cycles of reflected light 409. In the example shown in FIG. 4B, the charge information is read out from time of flight pixel circuitry 200 during periods in which the light source is ON 453 at the times indicated by RO 457. The time between ROs 457 is the frame time. Each frame may be in the tens of milliseconds. During one frame, hundreds of thousands of integrations/accumulations periods may happen corresponding to the hundreds of thousands of light pulses emitted by light source 103. Hence, RO 457 may occur after a plurality (e.g. hundreds of thousands) of reflected light pulses illuminate photodiode 205 and charges Q1 449 and Q2 451 are transferred a plurality of times to storage transistors 235 and 239, respectively. In so doing, charge is allowed to accumulate within storage transistors 235 and 239 over a plurality of cycles, which provides improved signal to noise ratio compared to a time of flight calculation based on only a single light pulse since the pulse width $T_{PW}$ 447 is so small due to the very short illumination pulses in the range of 20 nanoseconds to 100 nanoseconds.

FIG. 4B also illustrates an example in which light source 103 is OFF 455 for one or more periods to allow a background signal measurement 459 to be taken. In this example, background signals from storage transistors 235 and 239 are measured periodically when photodiode 205 is not illuminated with reflected light 409. This measurement may be taken at the end of the light OFF 455 period as shown. In one example, this measurement may be representative of ambient light and/or dark current in the pixel, which would add noise to the time of flight calculations. In one example, this background signal measurement 459 may be stored as calibration information and may be subtracted from the measurements taken during the light ON 453 periods to compensate for background noise when determining the time of flight $T_{TOF}$ 417 in accordance with the teaching of the present invention.

Figure 5:
FIG. 5 is a timing diagram illustrating an example operation of a time of flight pixel, in accordance with the teachings of the present invention.

FIG. 5 is a timing diagram illustrating an example operation of a time of flight pixel in accordance with the teachings of the present invention. As shown in FIG. 5, a control signal (SG1) controlling the gate of storage transistor 235 is driven to a first negative voltage 501 prior to transfer transistor 225 transferring the first Q1 449 to storage transistor 235. FIG. 5 shows a minichart labeled "ΣQ1 within SG1 511" that gives a visual representation of the accumulated image charge stored within storage transistor 235 corresponding with the timing of first modulation signal TX1 425. Minichart 511 shows that there is negligible (or no) image charge stored in storage transistor 235 when it is pre-biased with first negative voltage 501. Also shown in FIG. 5, a control signal (SG2) controlling the gate of storage transistor 239 is driven to a second negative voltage 503 prior to transfer transistor 229 transferring the first Q2 451 to storage transistor 239. FIG. 5 shows a minichart labeled "ΣQ2 within SG2 513" that gives a visual representation of the accumulated image charge stored within storage transistor 239 corresponding with the timing of second modulation signal TX2 429. Minichart 513 shows there is negligible (or no) image charge stored in storage transistor 239 when it is pre-biased with second negative voltage 503. It is appreciated that both negative voltages 501 and 503 are below a threshold voltage ($V_{TH}$ 507) of storage transistors 235 and 239, respectively. As an example, negative voltages 501 and 503 may be −1.2 V, and the activation voltage (applied to the gates) of the transistors may be around 2.8-3.2 V.

FIG. 5 also shows example control signals RST, SEL, OG1, and OG2 that control, respectively, reset transistor 255, select transistor 265, and output transistors 245 and 249 for reading out ΣQ1 and ΣQ2. These control signals may be generated by control circuitry 121. Referring back to FIG. 2, reset transistor 255 is coupled between voltage source VDD 257 and readout node 240. Readout node 240 is coupled to output transistors 245 and 249 and to amplifier transistor 260. Amplifier transistor 260 has a gate coupled to readout node 240 and operates as a source-follower that amplifies an input signal at the gate terminal of amplifier transistor 260 to an output signal at the source terminal of amplifier transistor 260. The drain terminal of amplifier transistor 260 may be coupled to voltage source VDD 257. Select transistor 265 is coupled between the source terminal of amplifier transistor 260 and BITLINE 267. Select transistor 265 is configured to selectively couple the output signal of amplifier transistor 260 to BITLINE 267 for reading out.

Referring back to FIG. 5, after the storage transistors are finished collecting image charge, the image charge will be readout. It is appreciated that FIG. 5 only shows three accumulation cycles before readout for illustration purposes, but that there may be hundreds or thousands of accumulation cycles between readouts. In the illustrated example, when a readout occurs, (e.g. RO 457), reset transistor 255 is activated a first time (via control signal RST). When reset transistor 255 is activated a first time, a known voltage (e.g. voltage source VDD 257) is coupled to readout node 240 to pre-charge readout node 240 a first time to a known voltage. Then, output transistor 245 is activated (via control signal OG1), which transfers the image charge (ΣQ1) stored within storage transistor 235 to readout node 240. Minichart 511 shows ΣQ1 within storage transistor 235 decreasing while output transistor 245 is activated. When ΣQ1 flows into readout node 240, it biases the gate of amplifier transistor 260, which puts a corresponding amplified voltage representing ΣQ1 onto the source terminal of amplifier transistor 260. Select transistor 265 is then activated a first time (via control signal SEL) which couples the amplified voltage to BITLINE 267 for readout.

In the illustrated example, reading out ΣQ2 after reading out ΣQ1 works similarly to reading out ΣQ1. Reset transistor 255 is activated a second time to pre-charge readout node 240 to a known voltage. Then, output transistor 249 is activated (via control signal OG2), which transfers the image charge (ΣQ2) stored within storage transistor 239 to readout node 240. Minichart 513 shows ΣQ2 within storage transistor 239 decreasing while output transistor 249 is activated. When ΣQ2 flows into readout node 240, it biases the gate of amplifier transistor 260, which puts a corresponding amplified voltage representing ΣQ2 onto the source terminal of amplifier transistor 260. Select transistor 265 is then activated a second time, which couples the amplified voltage to BITLINE 267 for readout.

In one example, for double correlated sampling purposes, control circuitry 121 may initiate a readout sequence (not shown) of readout node 240 after resetting reset transistor 255 and without ΣQ1 or ΣQ2 being present in readout node 240.

In one example of a readout sequence (not shown), readout node 240 is reset, and then OG2 is activated and ΣQ2 is readout. With ΣQ2 still in readout node 240, OG1 is activated which allows ΣQ1 to flow into readout node 240 and join ΣQ2. Then, with ΣQ1+ΣQ2 in readout node 240, readout node 240 is readout. Reading out ΣQ2 first and ΣQ1+ΣQ2 second may decrease the amount of processing required to calculate $T_{TOF}$ in accordance with Equation 3 of this disclosure. Those skilled in the art will appreciate that other readout sequences may be utilized to readout the image charge stored within storage transistors 235 and 239.

Referring once again to FIG. 2, the example shows an optional transistor set 299 that includes transfer transistor 269 (controlled with control signal TX3), storage transistor 279

(controlled with control signal SG3), and output transistor 289 (controlled with control signal OG3). Storage transistor 279 is coupled between transfer transistor 269 and output transistor 289. Optionally, transfer transistor 269 is coupled to photodiode 205 and output transistor 289 is coupled to readout node 240, in the illustrated example. In one example, optional transistor set 299 may be optionally used as a way to correct for possible aliasing of emitted light 105. In this example, transfer transistor 269 may be activated (via control signal TX3) to transfer image charge to storage transistor 279 after transfer transistor 229 is deactivated, but before transfer transistor 225 is activated. Optional transistor set 299 may be used to capture a brightness image during an OFF 455 period to provide a calibration reference to cancel out background illumination (e.g. ambient light 208) and attain a true reading of emitted light 105.

Figure 6:
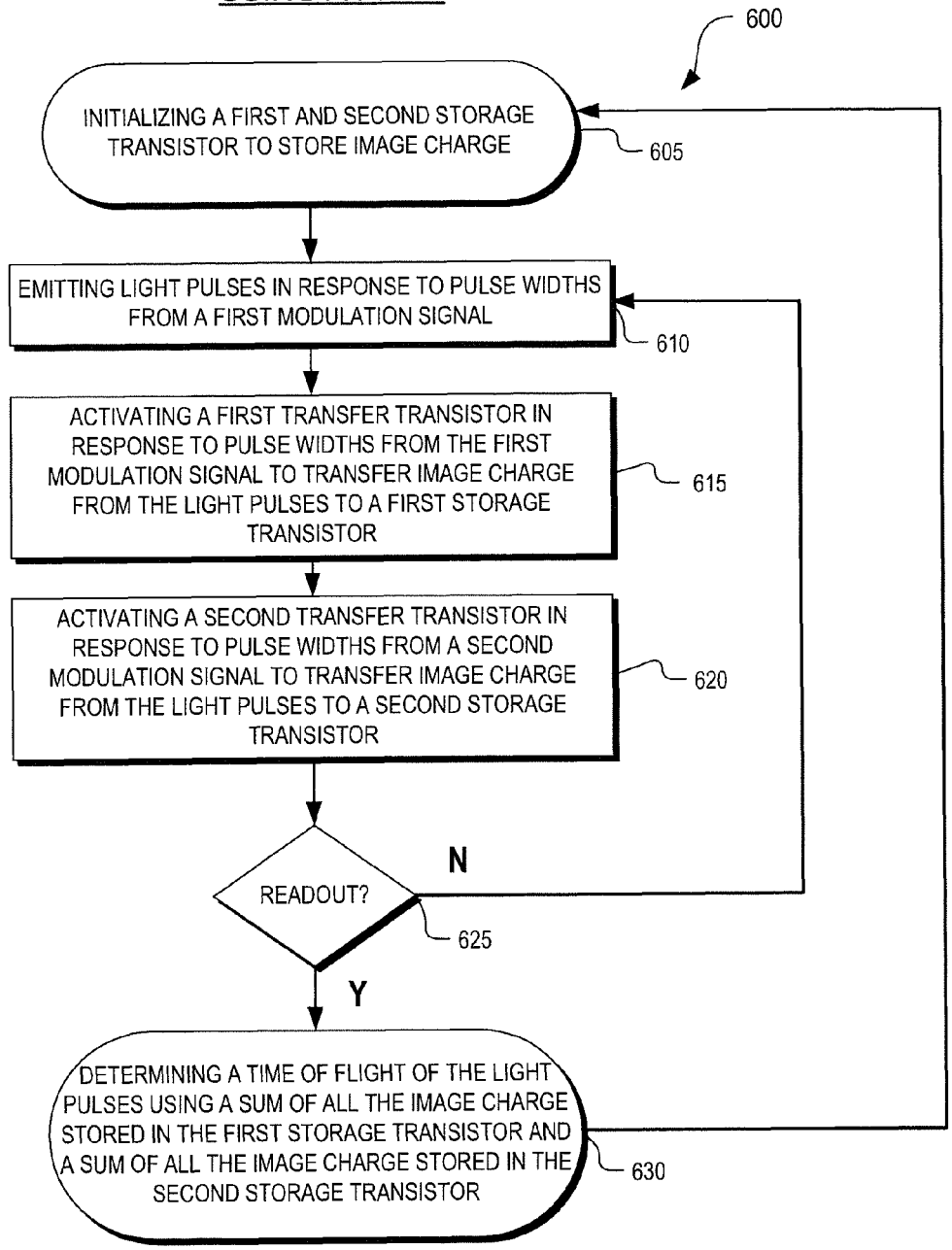
FIG. 6 is a flow chart illustrating an example process for determining a time of flight using a pixel, in accordance with the teaching of the present invention.

FIG. 6 is a flow chart illustrating an example process 600 for determining a time of flight using a pixel in accordance with the teaching of the present invention. The order in which some or all of the process blocks appear in process 600 should not be deemed limiting. Rather, one of ordinary skill in the art having the benefit of the present disclosure will understand that some of the process blocks may be executed in a variety of orders not illustrated, or even in parallel.

In process block 605, a first and second storage transistor (e.g. storage transistors 235 and 239) are initialized to store image charge over multiple accumulation periods. The initialization may include pre-biasing the gates of the storage transistors with a negative voltage such that holes are accumulated at surface states in anticipation of acquiring image charge. As discussed in connection with FIGS. 1-5, the holes at surface states may reduce the leakage current from draining the storage gates while they acquire image charge over multiple accumulation periods. A photodiode (e.g. photodiode 205) that receives the light pulses may be reset prior to process block 605.

In process block 610, a light pulse (e.g. emitted light 105) is emitted from a light source (e.g. light source 103) in response to a first modulation signal (e.g. TX1 425). In process block 615, a first transfer transistor (e.g. transfer transistor 225) is activated in response to pulse widths from the first modulation signal to transfer image charge (e.g. Q1 449) generated by the light pulse to a first storage transistor (e.g. storage transistor 235). The image charge is generated in a photodiode in response to incident light from the light pulse. In process block 620, a second transfer transistor (e.g. transfer transistor 229) is activated in response to pulse widths from a second modulation signal (e.g. TX2 429) to transfer image charge (e.g. Q2 451) generated by the light pulse to a second storage transistor (e.g. storage transistor 239).

If the multiple accumulation periods are over, ΣQ1 is readout from within the first storage transistor and ΣQ2 is readout from within the second storage transistor (process block 625). Process block 625 may correspond with ROs 457 in FIG. 4B. In one example discussed above, the ΣQ2 is first transferred into a readout node (e.g. readout node 240) and is readout. Then the ΣQ1 is transferred into the readout node so that the readout node holds ΣQ1+ΣQ2, and ΣQ1+ΣQ2 is readout. If ΣQ1 and ΣQ2 are not readout in process block 625, then the process returns to process block 610 for another accumulation period. If ΣQ1 and ΣQ2 are readout in process block 625, then a time of flight of the light pulses is determined using the ratio between the sums, as discussed above (process block 630). Once the time of flight has been determined in process block 630, the process may end or return to process block 605 to prepare the storage transistors for storing image charge over a subsequent frame of multiple accumulation periods.

Figure 7:
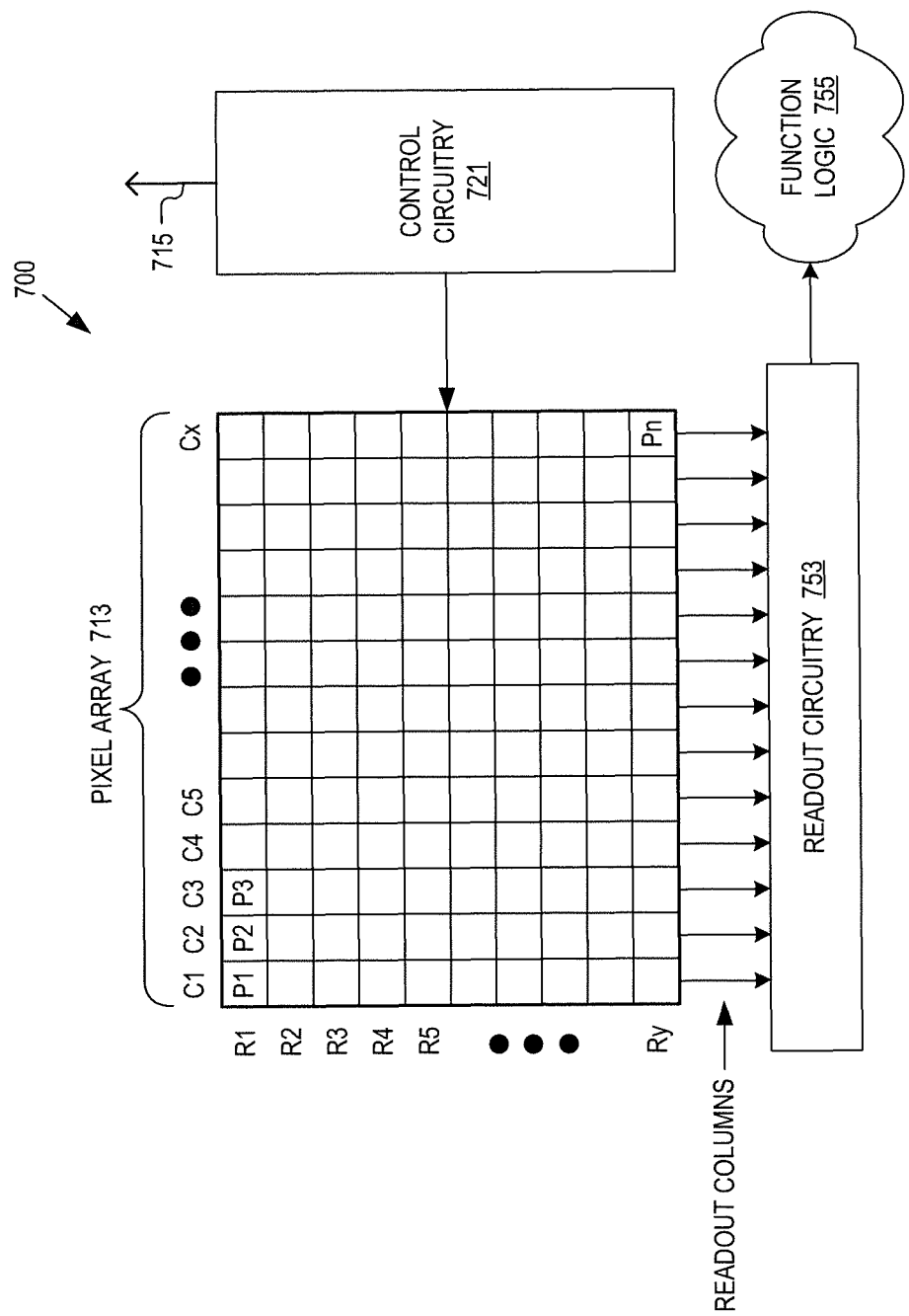
FIG. 7 is a block diagram that shows a portion of an example time of flight sensing system including a time of flight pixel array with corresponding readout circuitry, control circuitry, and function logic, in accordance with the teachings of the present invention.

FIG. 7 is a block diagram that shows a portion of an example time of flight sensing system 700 in greater detail in accordance with the teachings of the present invention. As shown, the illustrated example of time of flight sensing system 700 includes a time of flight pixel array 713, readout circuitry 753, function logic 755, and control circuitry 721. It is appreciated that time of flight pixel array 713 corresponds with time of flight pixel array 113 of FIG. 1A and that control circuitry 721 corresponds with control circuitry 121.

In the example illustrated in FIG. 7, time of flight pixel array 713 is a two dimensional (2D) array of time of flight pixels (e.g., pixels P1, P2 . . . , Pn). In one example, each of the time of flight pixels P1, P2, . . . , Pn may be substantially similar to the systems or time of flight pixel circuitry discussed above in FIGS. 1-6. As illustrated, each pixel is arranged into a row (e.g., rows R1 to Ry) and a column (e.g., column C1 to Cx) to acquire time of flight data of an object image focused onto time of flight pixel array 713. Thus, the time of flight data can then be used to determine the distance or depth information to the object in accordance with the teachings of the present invention.

In one example, after each pixel has accumulated its ΣQ1 and ΣQ2 charge information in the respective storage transistor as discussed above, the ΣQ1 and ΣQ2 signals are readout by readout circuitry 753 and transferred to function logic 755 for processing. Readout circuitry 753 may include amplification circuitry, analog-to-digital (ADC) conversion circuitry, or otherwise. In one example, function logic 755 may determine the time of flight and distance information for each pixel. In one example, function logic may also store the time of flight information and/or even manipulate the time of flight information (e.g., crop, rotate, adjust for background noise, or the like). In one example, readout circuitry 753 may readout a row of image data at a time along readout column lines (illustrated) or may readout the image data using a variety of other techniques (not illustrated), such as a serial readout or a full parallel readout of all pixels simultaneously.

In the illustrated example, control circuitry 721 is coupled to time of flight pixel array 713 to control the operation of time of flight pixel array 713. For example, control circuitry 721 may generate first modulation signal TX1 425 and second modulation signal TX2 429 to control the respective transfer transistors (e.g. transfer transistors 225 and 229) in each pixel of time of flight pixel array 713. Accordingly, control circuitry 721 may control the transfer of charge from the respective photodetectors to the respective storage transistors (e.g. storage transistors 235 and 239) as described above with respect to FIGS. 1-6. In one example, control circuitry 721 may also control the light source (e.g. light source 103) that emits the light pulses to the object (e.g. object 107) with sync signal 715 to synchronize the emission of the modulated light to the object to determine the time of flight information in accordance with the teachings of the present invention.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.).

For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
a photodiode configured to accumulate image charge, over an accumulation period, in response to each non-visible light pulse emitted from a light source that becomes incident upon the photodiode;
a first storage transistor configured to store, over multiple accumulation periods, a first sum of a first portion of the image charge, wherein the accumulation period is among the multiple accumulation periods;
a first transfer transistor coupled between the photodiode and the first storage transistor to selectively transfer the first portion of the image charge from the photodiode to the first storage transistor for storing over the multiple accumulation periods;
a first output transistor coupled to the first storage transistor to selectively transfer the first sum of the first portion of the image charge to a readout node;
a second storage transistor configured to store, over the multiple accumulation periods, a second sum of a second portion of the image charge;
a second transfer transistor coupled between the photodiode and the second storage transistor to selectively transfer the second portion of the image charge from the photodiode to the second storage transistor for storing over the multiple accumulation periods; and
a second output transistor coupled to the second storage transistor to selectively transfer the second sum of the second portion of the image charge to the readout node.

2. The apparatus of claim 1, further comprising control circuitry configured to apply a first negative voltage to a first gate of the first storage transistor and a second negative voltage to a second gate of the second storage transistor, wherein the first negative voltage is applied to the first gate before the first portion of the image charge is selectively transferred to the first storage transistor, and wherein the second negative voltage is applied to the second gate before the second portion of the image charge is selectively transferred to the second storage transistor.

3. The apparatus of claim 1, further comprising a reset transistor coupled to the readout node to selectively reset charge accumulated in the readout node.

4. The apparatus of claim 1, further comprising:
an amplifier transistor coupled to the readout node to amplify an image voltage corresponding to charge in the readout node; and
a row select transistor coupled between the amplifier transistor and a bitline.

5. The apparatus of claim 1, wherein the first portion of the image charge is generated within the photodiode over a first time period in the accumulation period and the second portion of the image charge is generated within the photodiode over a second time period in the accumulation period directly following the first time period.

6. The apparatus of claim 1, wherein the photodiode is a pinned photodiode.

7. The apparatus of claim 1, further comprising control circuitry configured to send a first modulation signal having a first on-time pulse width to activate the first transfer transistor to transfer the first portion of the image charge, wherein the control circuitry is configured to activate the first transfer transistor in sync with each non-visible light pulse emitted from the light source, and wherein a duration of the non-visible light pulse is the same as the first on-time pulse width of the first modulation signal.

8. The apparatus of claim 7, wherein the control circuitry is further configured to activate the second transfer transistor to transfer the second portion of the image charge in response to a second modulation signal having a second on-time pulse width immediately following the first on-time pulse width and with the duration of the non-visible light pulse, and wherein the light source does not emit light when the second transfer transistor is activated.

9. The apparatus of claim 1, further comprising:
a third storage transistor to store visible light image charge;
a third transfer transistor coupled between the photodiode and the third storage transistor to selectively transfer the visible light image charge from the photodiode to the third storage transistor; and
a third output transistor coupled to the third storage transistor to selectively transfer the visible light image charge to the readout node.

10. A time of flight ("TOF") imaging system comprising:
a light source coupled to emit light pulses in response to a first modulation signal; and
an array of imaging pixels having the imaging pixels arranged in rows and columns, wherein each imaging pixel includes:
a photodiode to accumulate an image charge;
a first storage transistor to store a first portion of the image charge;
a first transfer transistor coupled between the photodiode and the first storage transistor to selectively transfer the first portion of the image charge from the photodiode to the first storage transistor, in response to the first modulation signal;
a first output transistor coupled to the first storage transistor to selectively transfer the first portion of the image charge to a readout node;
a second storage transistor to store a second portion of the image charge;
a second transfer transistor coupled between the photodiode and the second storage transistor to selectively transfer the second portion of the image charge from the photodiode to the second storage transistor; and
a second output transistor coupled to the second storage transistor to selectively transfer the second portion of the image charge to the readout node.

11. The imaging system of claim 10, further comprising control circuitry configured to apply a first negative voltage to a first gate of the first storage transistor and a second negative voltage to a second gate of the second storage transistor, wherein the first negative voltage is applied to the first gate before the first portion of the image charge is selectively transferred to the first storage transistor, and wherein the second negative voltage is applied to the second gate before the second portion of the image charge is selectively transferred to the second storage transistor.

12. The imaging system of claim 10, further comprising a reset transistor coupled to the readout node to selectively reset charge accumulated in the readout node.

13. The imaging system of claim 10, further comprising:
an amplifier transistor coupled to the readout node to amplify an image voltage corresponding to charge in the readout node; and
a row select transistor coupled between the amplifier transistor and a bitline.

14. The imaging system of claim 10, wherein the first portion of the image charge is generated over a first time period and the second portion of the image charge is generated over a second time period directly following the first time period.

15. The imaging system of claim 10, further comprising control circuitry configured to send the first modulation signal having a first on-time pulse width to activate the first transfer transistor to transfer the first portion of the image charge, wherein the control circuitry is configured to activate the first transfer transistor in sync with a light pulse among the light pulses emitted from the light source, and wherein a duration of the light pulse is the same as the first on-time pulse width of the first modulation signal.

16. The apparatus of claim 15, wherein the control circuitry is further configured to activate the second transfer transistor to transfer the second portion of the image charge in response to a second modulation signal having a second on-time pulse width immediately following the first on-time pulse width and with the duration of the light pulse, and wherein the light source does not emit light when the second transfer transistor is activated.

17. A method of determining time of flight using a pixel, the method comprising:
initializing a first storage transistor and a second storage transistor for storing image charge generated in a photodiode over multiple accumulation periods;
emitting light pulses from a light source, wherein each of the light pulses is emitted from the light source in response to each one of first on-time pulse widths of a first modulation signal;
activating a first transfer transistor in response to each one of the first on-time pulse widths to transfer a first-in-time portion of an accumulated image charge to the first storage transistor, wherein the accumulated image charge is generated in the photodiode each time one of the light pulses reflects off of an object and illuminates the photodiode during one of the multiple accumulation periods;
activating a second transfer transistor in response to each one of second on-time pulse widths of a second modulation signal, wherein activating the second transfer transistor transfers a second-in-time portion of the accumulated image charge to the second storage transistor; and
determining a time of flight of the light pulses using a first sum of each of the first-in-time portions of the accumulated image charge transferred to the first storage transistor and a second sum of each of the second-in-time portions of the accumulated image charge transferred to the second storage transistor.

18. The method of claim 17, wherein the second on-time pulse widths immediately follow and have a same duration as the first on-time pulse widths.

19. The method of claim 17, wherein determining a time of flight of the light pulses includes:
activating a first output transistor coupled between the first storage transistor and a readout node to transfer the first sum to the readout node;
activating a second output transistor coupled between the second storage transistor and the readout node to transfer the second sum to the readout node; and
resetting a reset transistor coupled to the readout node.

20. The method of claim 17, wherein determining the time of flight of the light pulses includes multiplying a pulse width time of each of the light pulses by the second sum divided by a third sum of the first sum and the second sum.

21. The method of claim 17, wherein initializing the first storage transistor and the second storage transistor includes:
negatively biasing a first gate of the first storage transistor prior to activating the first transfer transistor in response to each one of the first on-time pulse widths; and
negatively biasing a second gate of the second storage transistor prior to activating the second transfer transistor in response to each one of the second on-time pulse widths.

22. The method of claim 21, wherein negatively biasing the first gate of the first storage transistor and the second gate of the second storage transistor reduces leakage current.

23. The method of claim 21, wherein the first gate is negatively biased to at least 0.5 volts below a first threshold voltage of the first storage transistor and the second gate is negatively biased to at least 0.5 volts below a second threshold voltage of the second storage transistor.

24. The method of claim 17, wherein the first storage transistor is coupled between the first transfer transistor and a first output transistor coupled to a readout node, and wherein the second storage transistor is coupled between the second transfer transistor and a second output transistor coupled to the readout node.

25. The method of claim 17, wherein the multiple accumulation periods number more than one-thousand accumulation periods, and wherein the determining the time of flight of the light pulses occurs after the multiple accumulation periods.

26. The method of claim 17, further comprising:
activating a third transfer transistor to transfer visible light image charge from the photodiode to a third storage transistor between the multiple accumulation periods, wherein activating the third transfer transistor is at an image time when the first transfer transistor and the second transfer transistor are not activated.

27. The method of claim 17, wherein the light pulses are substantially near-infrared light centered between 800 and 900 nm.

* * * * *